United States Patent
Yu

(10) Patent No.: US 10,971,698 B2
(45) Date of Patent: Apr. 6, 2021

(54) OLED DISPLAY PANEL AND MANUFACTURING METHOD FOR THE SAME

(71) Applicant: Wuhan China Star Optoelectronics Semiconductor Display Technology Co., Ltd., Hubei (CN)

(72) Inventor: Wei Yu, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 193 days.

(21) Appl. No.: 16/091,372

(22) PCT Filed: Sep. 12, 2018

(86) PCT No.: PCT/CN2018/105332
§ 371 (c)(1),
(2) Date: Oct. 4, 2018

(87) PCT Pub. No.: WO2019/196333
PCT Pub. Date: Oct. 17, 2019

(65) Prior Publication Data
US 2020/0044186 A1   Feb. 6, 2020

(30) Foreign Application Priority Data
Apr. 11, 2018   (CN) .......................... 201810322892.5

(51) Int. Cl.
*H01L 51/52* (2006.01)
*B23K 26/352* (2014.01)
(Continued)

(52) U.S. Cl.
CPC ........ *H01L 51/5246* (2013.01); *B23K 26/352* (2015.10); *B23K 26/38* (2013.01);
(Continued)

(58) Field of Classification Search
CPC ................. H01L 51/5246; H01L 51/51; H01L 2227/323; H01L 2251/566;
(Continued)

(56) References Cited

U.S. PATENT DOCUMENTS

2012/0287026 A1 * 11/2012 Masuda ............. H01L 27/3272
345/76
2015/0243925 A1   8/2015 Huang et al.
(Continued)

FOREIGN PATENT DOCUMENTS

CN          102754524         10/2012
CN          103943648 B    *  11/2016

*Primary Examiner* — Nilufa Rahim
*Assistant Examiner* — Scott E Bauman
(74) *Attorney, Agent, or Firm* — Leong C. Lei

(57) ABSTRACT

An OLED display panel and manufacturing method are provided. Through disposing a light-shielding film on the packaging cover plate to prevent the laser from illuminating on the electrodes of the MED substrate during the laser scanning of the sealant to effectively protect the electrode. A portion of the light shielding film that overlaps with the thin layer region of the sealant has gradually decreasing light transmittance, which can prevent the problem that the thin layer region of the sealant is scorched by excessive laser energy, sufficiently ensures that the packaging effect, and reduces the generation of particles. In addition, the surface of the light-shielding film irradiated with laser light is a frosted surface, which can cause diffused reflection of the laser light irradiated on the light-shielding film to prevent the laser from directly reflecting on the laser head and protect the laser head from being burned and damaged.

5 Claims, 25 Drawing Sheets

(51) Int. Cl.
    *B23K 26/38*     (2014.01)
    *B32B 37/12*     (2006.01)
    *B32B 38/00*     (2006.01)
    *H01L 51/56*     (2006.01)
    *H01L 27/32*     (2006.01)

(52) U.S. Cl.
    CPC .......... *B32B 37/12* (2013.01); *B32B 38/0004* (2013.01); *B32B 38/0008* (2013.01); *H01L 27/3244* (2013.01); *H01L 51/56* (2013.01); *B32B 2037/1253* (2013.01); *B32B 2457/206* (2013.01); *H01L 2227/323* (2013.01); *H01L 2251/566* (2013.01)

(58) Field of Classification Search
    CPC ...... H01L 27/3244–3279; H01L 51/56; B23K 26/352; B23K 26/38; B32B 38/0004; B32B 38/0008; B32B 2037/1253; B32B 2457/206; B32B 37/12
    See application file for complete search history.

(56) References Cited

U.S. PATENT DOCUMENTS

| | | | |
|---|---|---|---|
| 2016/0284942 A1* | 9/2016 | Gao | H01L 33/483 |
| 2016/0372529 A1* | 12/2016 | Wu | H01L 51/56 |
| 2017/0054107 A1* | 2/2017 | Liu | H01L 51/56 |
| 2017/0183767 A1* | 6/2017 | Hong | C23C 14/58 |

* cited by examiner

OLED DISPLAY PANEL AND MANUFACTURING METHOD FOR THE SAME

RELATED APPLICATIONS

The present application is a National Phase of International Application Number PCT/CN2018/105332, filed Sep. 12, 2018, and claims the priority of China Application No. 201810322892.5 filed Apr. 11, 2018.

FIELD OF THE INVENTION

The present invention relates to a display technology field, and more particularly to an OLED display panel and manufacturing method for the same.

BACKGROUND OF THE INVENTION

An Organic Light Emitting Display (OLED) is a new generation of display. The OLED device generally includes a cathode, an anode, and an organic thin film clamped between the cathode and the anode. After the voltage is applied between the cathode and the anode, the organic thin film emits a light. The OLED display has many advantages such as self-luminous properties, fast response, wide viewing angle, and color saturation comparing to the liquid crystal display.

The water oxygen in the air will oxidize the active metal at the cathode of the OLED device and will react with the organic material, which will cause the OLED device to fail. Therefore, the effective encapsulation of the OLED device such that the OLED device is isolated from water and oxygen is essential for prolonging the life of the OLED device.

Currently, the packaging method for the OLED mainly includes: dry film and UV adhesive, surface encapsulation, frit adhesive (glass cement) encapsulation, thin film encapsulation. Because the frit adhesive has a good encapsulation effect, and the encapsulation method is convenient for different products with different sizes. Therefore, the fit adhesive encapsulation is an encapsulation method having great development potential. The fit adhesive encapsulation generally includes following steps:

Step 1: as shown in FIG. 1, coating multiple rectangular frit adhesive 300 on a packaging cover plate 100 which has been cleaned;

Step 2: as shown in FIG. 2, baking and curing the frit adhesive 300 in a high temperature. Usually, the baking temperature is greater than 500° C. Because of the material property of the frit adhesive 300, after coating, and high temperature baking, a cross-section of the frit adhesive 300 is trapezoidal;

Step 3: as shown in FIG. 3, in an N2 environment, coating an LV adhesive 700 at an outer periphery of the packaging cover plate 100 coated with the frit adhesive 300. The purpose of coating the UV adhesive 700 is to temporarily fix the packaging cover plate 100 and the OLED substrate 200 before sealing and connecting the packaging cover plate 100 and the OLED substrate 200 in order to temporarily isolate the OLED device 220 from the external air so as to have a fake package effect;

Step 4: as shown in FIG. 4 to FIG. 6, in the N2 environment, aligning and adhering the packaging cover plate 100 with the OLED substrate 200, and after the UV irradiation, the UV adhesive 700 is cured;

Step 5, as shown in FIG. 7, in an atmospheric environment, scanning the frit adhesive 300 from a side of the packaging cover plate 100 using a laser beam 950. Through the high temperature of the laser, the frit adhesive 300 is melt, cooled and cured in order to reach the purpose of adhering the packaging cover plate 100 and the OLED substrate 200 to have a real packaging effect;

Step 6, as shown in FIG. 8 to FIG. 10, cutting the outer periphery of the frit adhesive 300 along a cutting line 910, and discarding the scrap with the UV adhesive 700 to obtain an OLED display panel packaged by the frit adhesive 300 (panel).

The above frit adhesive encapsulation process generally has following problems:

The first problem is: as shown in FIG. 11, in the step 5 of the above frit adhesive encapsulation process, in order to fully cure the frit adhesive 300, a diameter of the laser beam 950 is greater than the width of the fit adhesive 300. However, a portion of the laser that exceeds the frit adhesive 300 will irradiate the electrode 230 of the OLED substrate 200 through the packaging cover plate 100, which will make the electrode 230 of the OLED substrate 200 to be scorched such that the OLED device 220 is failure.

As shown in FIG. 12, in order to avoid the above situation, one solution is to add a mask in the current machine. After being processed by the alignment system, a light-blocking region of a mask 850 blocks a portion of the laser beam 950 that exceeds the width of the frit adhesive 300 so that the laser beam irradiates on the fit adhesive 300 in order to protect the electrode 230 on the OLED substrate 200, however, the above method also exits the following problems: first, the above method requires to adopt a precise alignment system to support, the equipment is expensive, and easily to be abnormal; second, the laser beam blocked by the mask 850 will be reflected back to the laser head 810 such that the laser head 810 is burned and damaged.

The second problem is: as shown in FIG. 2, the frit adhesive 300 is trapezoidal after the step 2, that is, including a thick layer region at the middle portion and a thin layer region at two sides. As shown in FIG. 7, in the scanning process of the frit adhesive 300, because energies at different regions of the laser beam 950 are the same, the thin layer region at two sides of the frit adhesive 300 will be burned by overmuch laser energy, which will affect the packaging effect, and particles by burning will also affect subsequent processes.

SUMMARY OF THE INVENTION

The purpose of the present invention is to provide a manufacturing method for an OLED display panel, which can protect the electrode on the OLED substrate from being scorched in the scanning process of laser, prevent the thin layer region of the sealant from being scorched by overmuch laser energy, ensure the packaging effect, reduce the generation of the particles, and protect the laser head from being scorched and damaged.

The purpose of the present invention is also to provide an OLED display panel manufactured by the above OLED display panel, which has a better packaging effect and high production yield.

In order to achieve the above purpose, the present invention provides a manufacturing method for an OLED display panel comprising steps of:

step 1: providing a packaging cover plate, wherein the packaging cover plate includes a main body, and a first light-shielding film and a second light-shielding film which are disposed on the main body; the main body is provided with one or multiple sealant coating region; the sealant coating region includes a sealant thick region, and a first sealant thin region and a second sealant thin region which are located at two sides of the sealant thick region; the first light-shielding film and the second light-shielding film are correspondingly, disposed at two sides of the sealant thick region;

defining an edge of each of the first sealant thin region, the second sealant thin region, the first light-shielding film and a second light-shielding film which is closed to the sealant thick region as an inner edge, and defining an edge of each of the first sealant thin region, the second sealant thin region, the first light-shielding film and the second light-shielding film which is away from the sealant thick region as an outer edge;

an inner edge of the first light-shielding film and an inner edge of the first sealant thin region are aligned; an outer edge of the first light-shielding film exceeds an outer edge of the first sealant thin region; an inner edge of the second light-shielding film and an inner edge of the second sealant region are aligned; an outer edge of the second light-shielding film exceeds an outer edge of the second sealant thin region;

the first light-shielding film includes a first semi-transparent region that is completely overlapped with the first sealant thin region and a first light-blocking region that is disposed outside the first semi-transparent region; the transmittance of the first semi-transparent region is gradually decreased along direction from the inner edge to the outer edge of the first light-shielding film;

the second light-shielding film includes a second semi-transparent region that is completely overlapped with the second sealant thin region and a second light-blocking region that is disposed inside the second semi-transparent region; the transmittance of the second semi-transparent region is gradually decreased along a direction from the inner edge to the outer edge of the second light-shielding film;

step 2: coating a sealant at the one or the multiple sealant coating regions on the packaging coverplate, and baking and curing the sealant; and step 3: providing an OLED substrate, aligning the packaging cover plate with the OLED substrate; using a laser beam to scan the sealant from a side of the packaging cover plate so as to cure the sealant in order to obtain an OLED display panel.

Wherein the step 3 comprises steps of: step 31: coating an UV adhesive at an outer periphery of the one or the multiple sealant coating regions of the packaging cover plate; step 32: providing the OILED substrate, and aligning and adhering the packaging cover plate with the OLED substrate to obtain an OLED encapsulation structure, and performing an UV light irradiation to the UV adhesive in the OLED encapsulation structure to cure the UV adhesive; step 33: using the laser beam to scan the sealant from the side of the packaging cover plate in the OLED encapsulation structure in order to cure the sealant; and step 34: cutting the OLED encapsulation structure along a cutting line between the sealant and the UV adhesive, and discarding the scrap with the UV adhesive to obtain the OLED display panel packaged by the sealant.

Wherein the first semi-transparent region is provided with multiple hollow patterns, areas of the multiple hollow patterns in the first semi-transparent region are the same, the density of the multiple hollow patterns is gradually decreased along a direction from the inner edge to the outer edge of the first light-shielding film; or, the multiple hollow patterns are evenly distributed in the first semi-transparent region, and areas of the multiple hollow patterns are gradually decreased along a direction from the inner edge to the outer edge of the first light-shielding film; and the second semi-transparent region is provided with multiple hollow patterns, areas of the multiple hollow patterns in the second semi-transparent region are the same, the density of the multiple hollow patterns is gradually decreased along a direction from the inner edge to the outer edge of the second light-shielding film; or, the multiple hollow patterns are evenly distributed in the second semi-transparent region, and areas of the multiple hollow patterns are gradually decreased along a direction from the inner edge to the outer edge of the second light-shielding film.

Wherein a surface of a region of the main body corresponding to the first light-shielding film and the second light-shielding film is frosted such that a surface of each of the first light-shielding film and the second light-shielding film contacting with the main body is a frosted surface; the sealant is a glass cement; in the step 2, a temperature for baking and curing is greater than 500° C.; after baking and curing, a cross section of the sealant is trapezoidal; the sealant includes a thick layer region corresponding to the sealant thick region, and a first thin layer region and a second thin layer region respectively corresponding to the first sealant thin region and the second sealant thin region.

Wherein in step 3, a diameter of the laser beam is greater than a width of the sealant coating region; outer edges of the first light-shielding film and the second light-shielding film respectively exceed two sides of the laser beam; a material of each of the first light-shielding film and the second light-shielding film is an opaque material having a reflective property or a black light-shielding material without a reflective property; the sealant is a glass cement.

The present invention also provides with an OLED display panel, comprising a packaging cover plate, an OLED substrate disposed oppositely, and a sealant disposed between the packaging cover plate and an OLED substrate;

wherein the packaging cover plate includes a main body, a first light-shielding film and a second light-shielding film disposed on the main body, the main body is provided with one or multiple sealant coating region, the sealant coating region includes a sealant thick region and a first sealant thin region and a second sealant thin region which are located at two sides of the sealant thick region; the first light-shielding film and the second light-shielding film are correspondingly disposed at two sides of the sealant thick region;

defining an edge of each of the first sealant thin region, the second sealant thin region, the first light-shielding film and the second light-shielding film which is closed to the sealant thick region as an inner edge, and defining an edge of each of the first sealant thin region, the second sealant thin region, the first light-shielding film and the second light-shielding film which is away from the sealant thick region as an outer edge;

an inner edge of the first light-shielding film and an inner edge of the first sealant thin region are aligned; an outer edge of the first light-shielding film exceeds an outer edge of the first sealant thin region; an inner edge of the second light-shielding film and an inner edge of the second sealant region are aligned; an outer edge of the second light-shielding film exceeds an outer edge of the second sealant thin region;

the first light-shielding film includes a first semi-transparent region that is completely overlapped with the first sealant thin region and a first light-blocking region that is disposed outside the first semi-transparent region; the transmittance of the first semi-transparent region is gradually decreased along a direction from the inner edge to the outer edge of the first light-shielding film;

the second light-shielding film includes a second semi-transparent region that is completely overlapped with the second sealant thin region and a second light-blocking region that is disposed inside the second semi-transparent region; the transmittance of the second semi-transparent region is gradually decreased along a direction from the inner edge to the outer edge of the second light-shielding film.

Wherein the first semi-transparent region is provided with multiple hollow patterns, areas of the multiple hollow patterns in the first semi-transparent region are the same, the density of the multiple hollow patterns is gradually decreased along a direction from the inner edge to the outer edge of the first light-shielding film; or, the multiple hollow patterns are evenly distributed in the first semi-transparent region, and areas of the multiple hollow patterns are gradually decreased along a direction from the inner edge to the outer edge of the first light-shielding film; and the second semi-transparent region is provided with multiple hollow patterns, areas of the multiple hollow patterns in the second semi-transparent region are the same, the density of the multiple hollow patterns is gradually decreased along a direction from the inner edge to the outer edge of the second light-shielding film; or, the multiple hollow patterns are evenly distributed in the second semi-transparent region, and areas of the multiple hollow patterns are gradually decreased along a direction from the inner edge to the outer edge of the second light-shielding film.

Wherein a surface of a region of the main body corresponding to the first light-shielding film and the second light-shielding film is frosted such that a surface of each of the first light-shielding film and the second light-shielding film contacting with the main body is a frosted surface.

Wherein the sealant is a glass cement, a cross section of the sealant is trapezoidal; the sealant includes a thick layer region corresponding to the sealant thick region, and a first thin layer region and a second thin layer region respectively corresponding to the first sealant thin region and the second sealant thin region.

Wherein a material of each of the first light-shielding film and the second light-shielding film is an opaque material having a reflective property or a black light-shielding material without a reflective property; the sealant is a glass cement.

The present invention also provides, an OLED display panel, comprising a packaging cover plate, an OLED substrate disposed oppositely, and a sealant disposed between the packaging cover plate and an OLED substrate;

wherein the packaging cover plate includes a main body, a first light-shielding film and a second light-shielding film disposed on the main body, the main body is provided with one or multiple sealant coating region, the sealant coating region includes a sealant thick region and a first sealant thin region and a second sealant thin region which are located at two sides of the sealant thick region; the first light-shielding film and the second light-shielding film are correspondingly disposed at two sides of the sealant thick region;

defining an edge of each of the first sealant thin region, the second sealant thin region, the first light-shielding film and the second light-shielding film which is closed to the sealant thick region as an inner edge, and defining an edge of each of the first sealant thin region, the second sealant thin region, the first light-shielding film and the second light-shielding film which is away from the sealant thick region as an outer edge;

an inner edge of the first light-shielding film and an inner edge of the first sealant thin region are aligned; an outer edge of the first light-shielding film exceeds an outer edge of the first sealant thin region; an inner edge of the second light-shielding film and an inner edge of the second sealant region are aligned; an outer edge of the second light-shielding film exceeds an outer edge of the second sealant thin region;

the first light-shielding film includes a first semi-transparent region that is completely overlapped with the first sealant thin region and a first light-blocking region that is disposed outside the first semi-transparent region; the transmittance of the first semi-transparent region is gradually decreased along a direction from the inner edge to the outer edge of the first light-shielding film;

the second light-shielding film includes a second semi-transparent region that is completely overlapped with the second sealant thin region and a second light-blocking region that is disposed inside the second semi-transparent region; the transmittance of the second semi-transparent region is gradually decreased along a direction from the inner edge to the outer edge of the second light-shielding film;

the first semi-transparent region is provided with multiple hollow patterns, areas of the multiple hollow patterns in the first semi-transparent region are the same, the density of the multiple hollow patterns is gradually decreased along a direction from the inner edge to the outer edge of the first light-shielding film; or, the multiple hollow patterns are evenly distributed in the first semi-transparent region, and areas of the multiple hollow patterns are gradually decreased along a direction from the inner edge to the outer edge of the first light-shielding film;

the second semi-transparent region is provided with multiple hollow patterns, areas of the multiple hollow patterns in the second semi-transparent region are the same, the density of the multiple hollow patterns is gradually decreased along a direction from the inner edge to the outer edge of the second light-shielding film; or, the multiple hollow patterns are evenly distributed in the second semi-transparent region, and areas of the multiple hollow patterns are gradually decreased along a direction from the inner edge to the outer edge of the second light-shielding film;

a surface of a region of the main body corresponding to the first light-shielding film and the second light-shielding film is frosted such that a surface of each of the first light-shielding film and the second light-shielding film contacting with the main body is a frosted surface;

the sealant is a glass cement, a cross section of the sealant is trapezoidal; the sealant includes a thick layer region corresponding to the sealant thick region, and a first thin layer region and a second thin layer region respectively corresponding to the first sealant thin region and the second sealant thin region; and a material of each of the first light-shielding film and the second light-shielding film is an opaque material having a reflective property or a black light-shielding material without a reflective property; the sealant is a glass cement.

The beneficial effects of the present invention: in the method for fabricating the MED display panel, a light-shielding film is disposed on the packaging cover plate to prevent the laser from illuminating on the electrodes of the OLED substrate during the laser scanning of the sealant, so as to effectively protect the electrode. The light shielding film is also provided. The portion of the thin layer region that overlaps with the thin layer region of the sealant 30 has gradually decreasing light transmittance, which can prevent the problem that the thin layer region of the sealant is scorched by excessive laser energy, sufficiently ensures that the packaging effect, and reduces the generation of particles. In addition, the surface of the light-shielding film irradiated with laser light is also provided with a frosted surface, which can cause diffused reflection of the laser light irradiated on the light-shielding film to prevent the laser from directly reflecting on the laser head 81 and protect the laser head 81 from being burned and damaged. The OLED display panel is manufactured based on the manufacturing method of the OLED display panel. By providing a light shielding film on the packaging cover plate, the packaging effect can be improved and the production yield can be improved.

For a further understanding of the features and technical content of the present invention, please refer to the following detailed description of the invention and the accompanying drawings. However, the drawings are provided for reference and description only, and are not intended to limit the present invention.

BRIEF DESCRIPTION OF THE DRAWINGS

The technical solutions and other beneficial effects of the present invention will be apparent from the following detailed description of specific embodiments of the present invention with reference to the attached drawings.

In the drawings.

DETAILED DESCRIPTION OF THE PREFERRED EMBODIMENT

In order to describe the technology solution and the effect of the present invention in detail, the following combines with the preferred embodiments and the drawings for illustrate the present invention.

Figure 1:
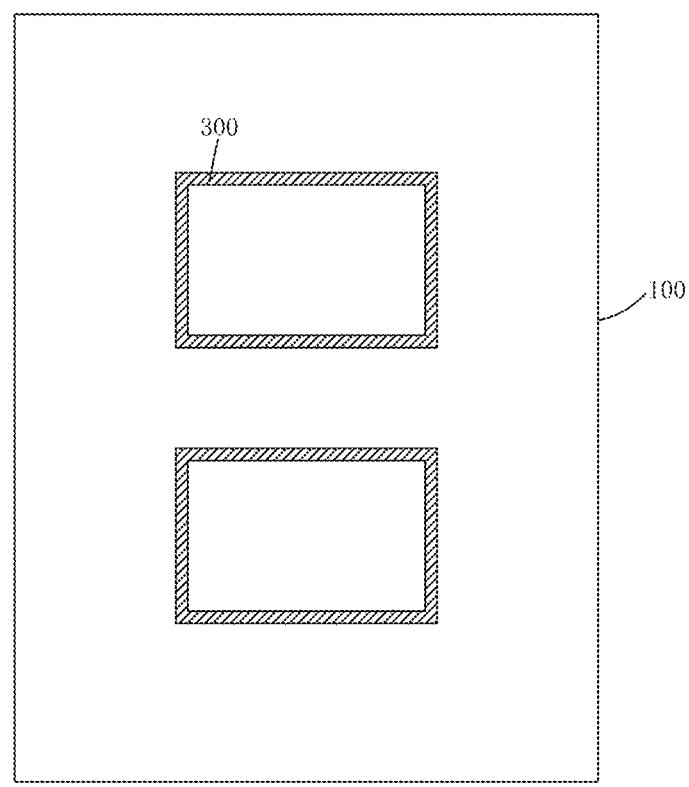
FIG. 1 is a schematic top view of step 1 of a conventional frit adhesive encapsulation process.
Figure 2:
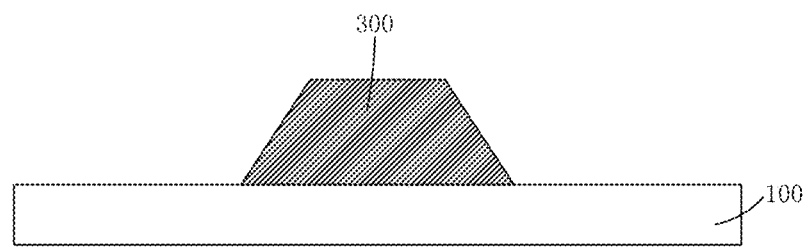
FIG. 2 is a cross-sectional schematic view of a frit adhesive in step 2 of a conventional frit adhesive encapsulation process after baking.
Figure 3:
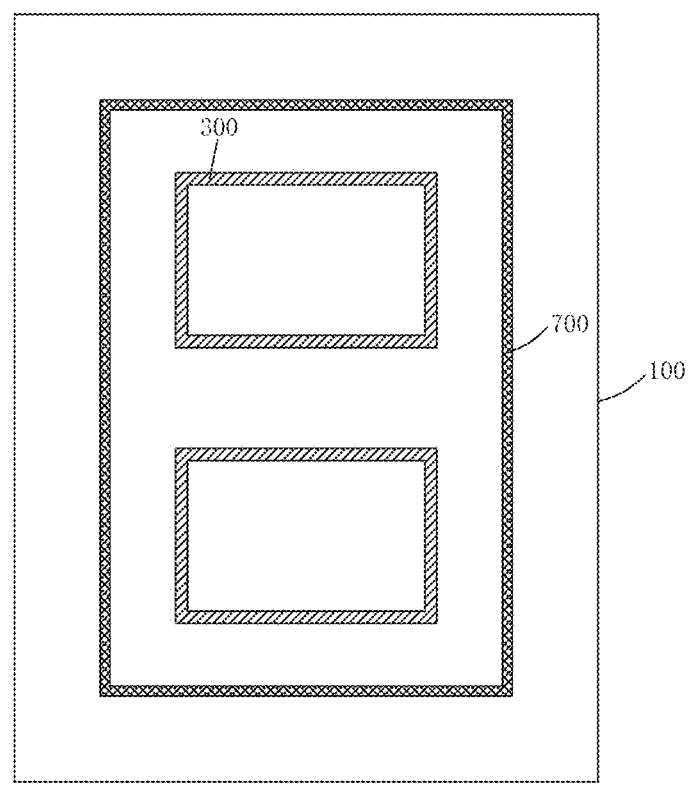
FIG. 3 is a schematic top view of step 3 of a conventional fit adhesive encapsulation process.
Figure 4:
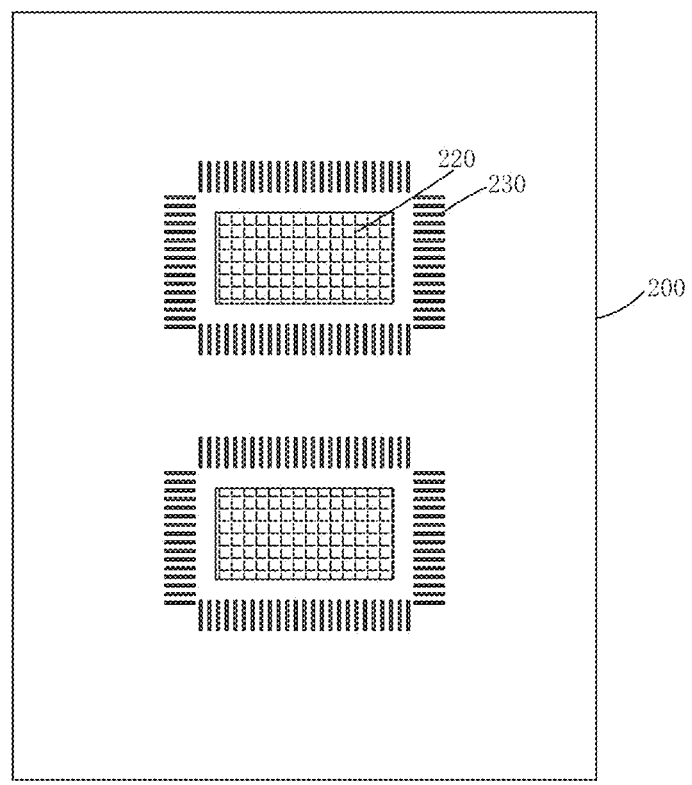
FIG. 4 is a schematic top view of a conventional OLED substrate.
Figure 5:
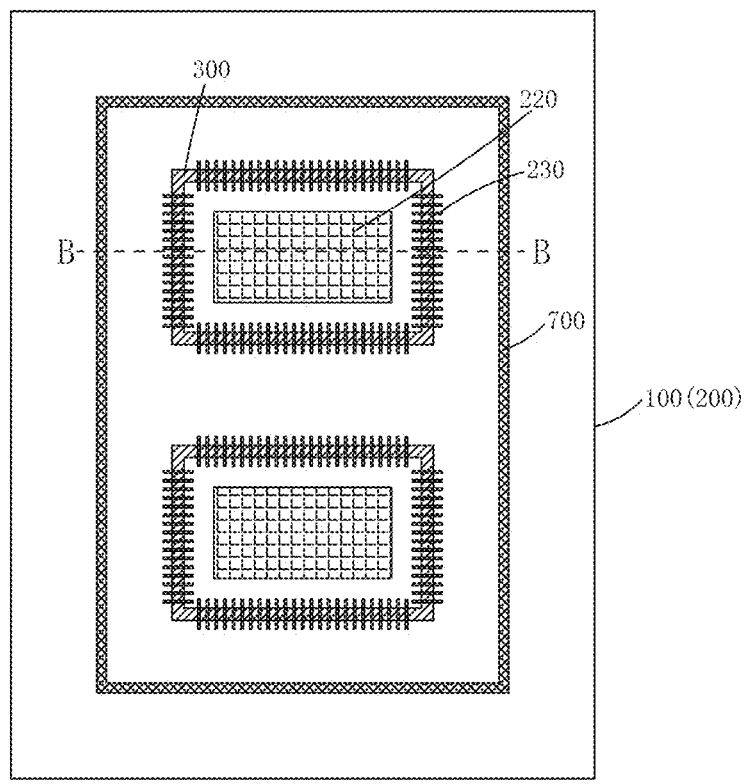
FIG. 5 is a schematic top view of step 4 of a conventional frit adhesive encapsulation process.
Figure 6:
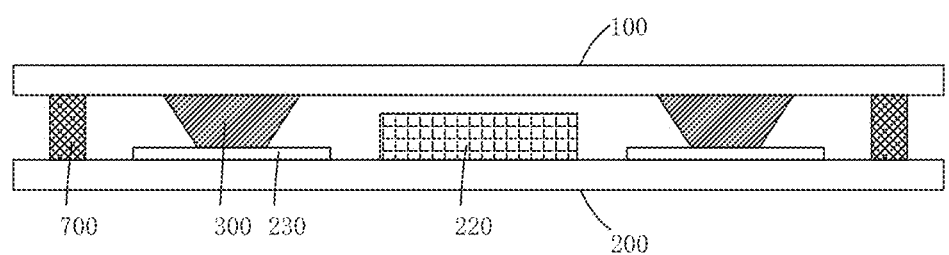
FIG. 6 is a schematic sectional view along B-B line in FIG. 5.
Figure 7:
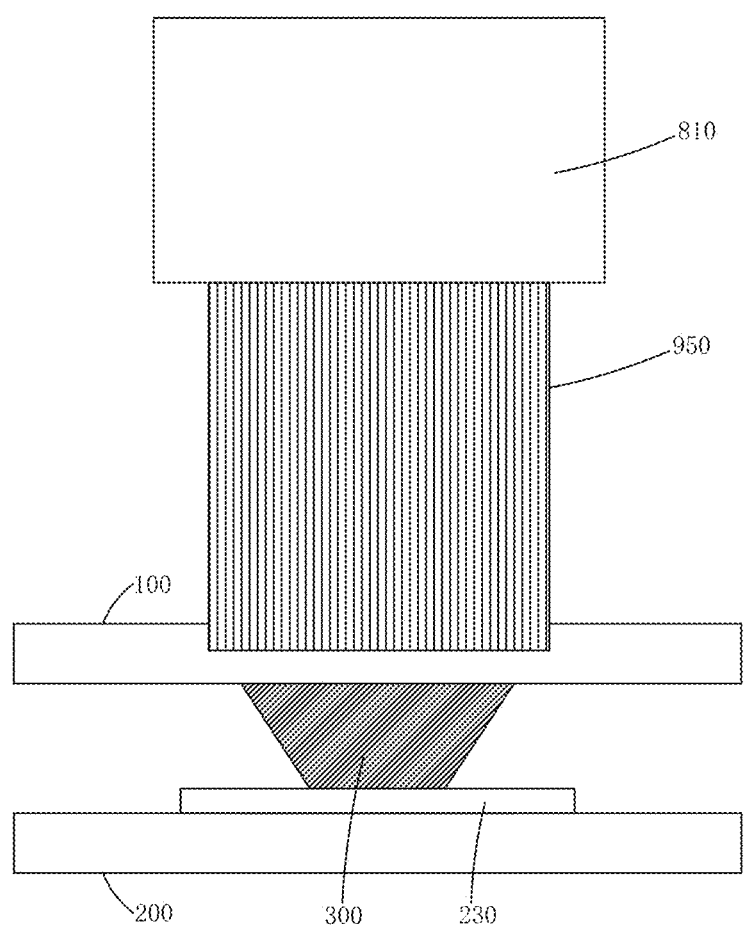
FIG. 7 is a schematic cross-sectional view of step 5 of a conventional frit adhesive encapsulation process.
Figure 8:
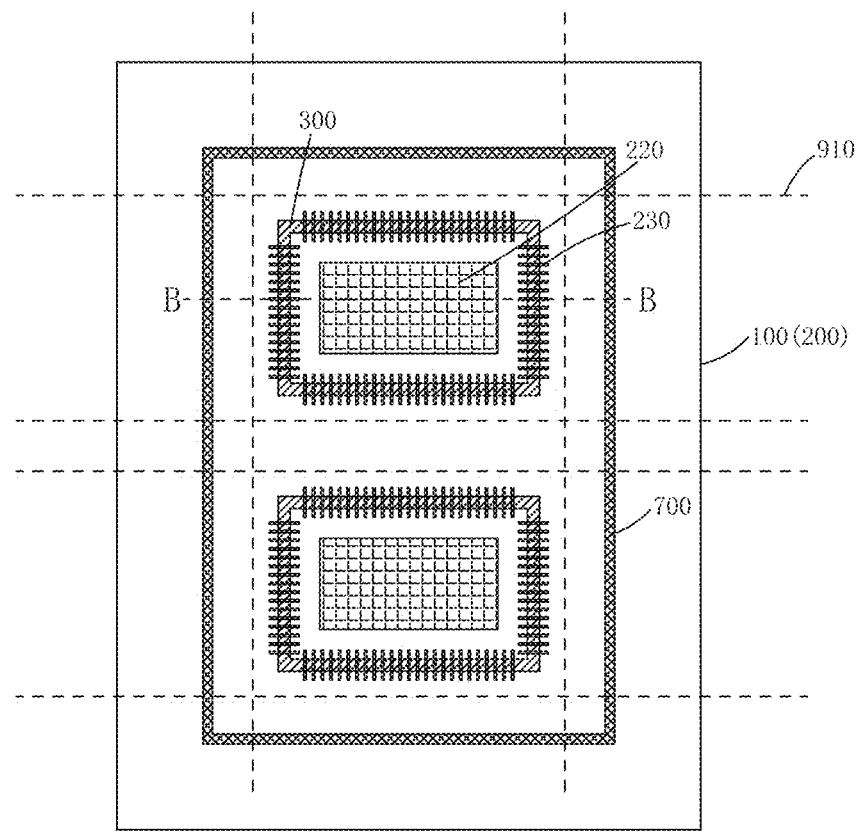
FIG. 8 is a schematic top view of step 6 of a conventional fit adhesive encapsulation process.
Figure 9:
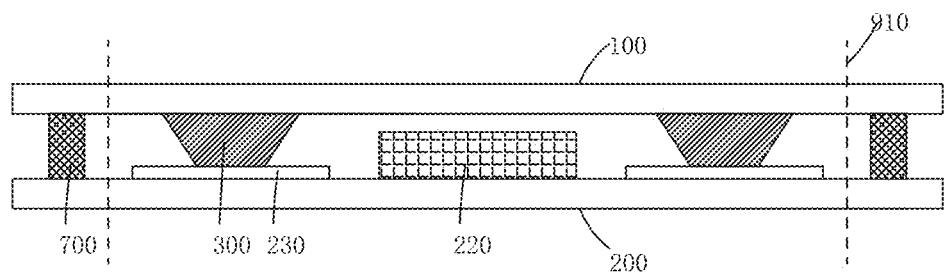
FIG. 9 is a schematic sectional view along B-B line in FIG. 8.
Figure 10:
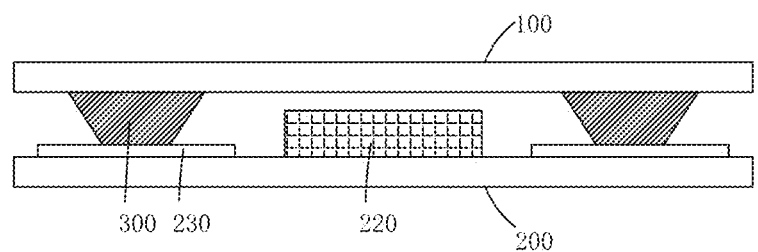
FIG. 10 is a schematic cross-sectional view of an OLED display panel manufactured in step 6 of the conventional frit adhesive encapsulation process.
Figure 11:
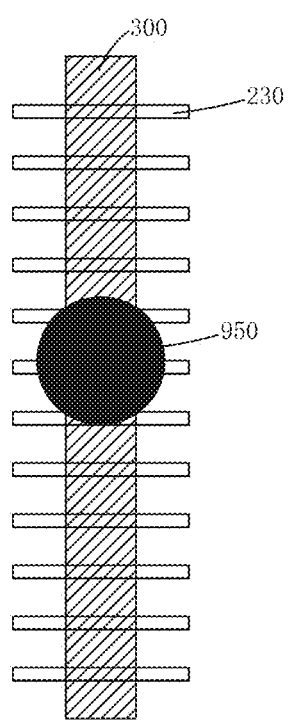
FIG. 11 is a schematic diagram of a laser beam having a diameter larger than a width of a frit adhesive in step 5 of a conventional frit adhesive encapsulation process.
Figure 12:
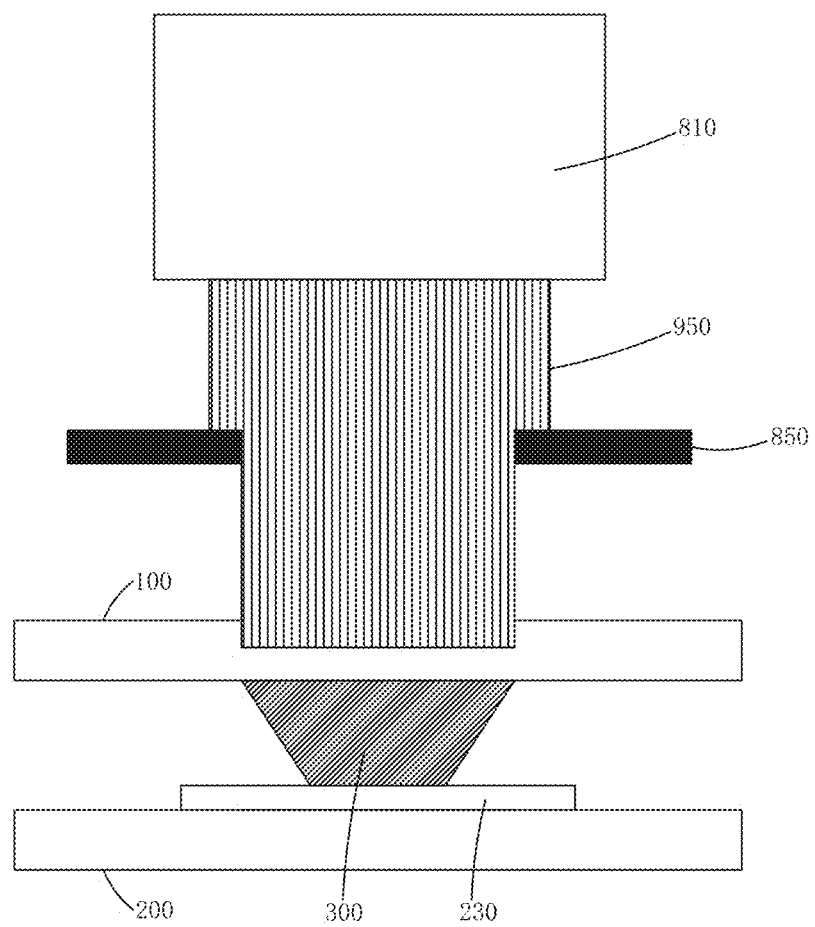
FIG. 12 is a schematic diagram of adding a mask plate in step 5 of the conventional frit adhesive encapsulation process.
Figure 13:
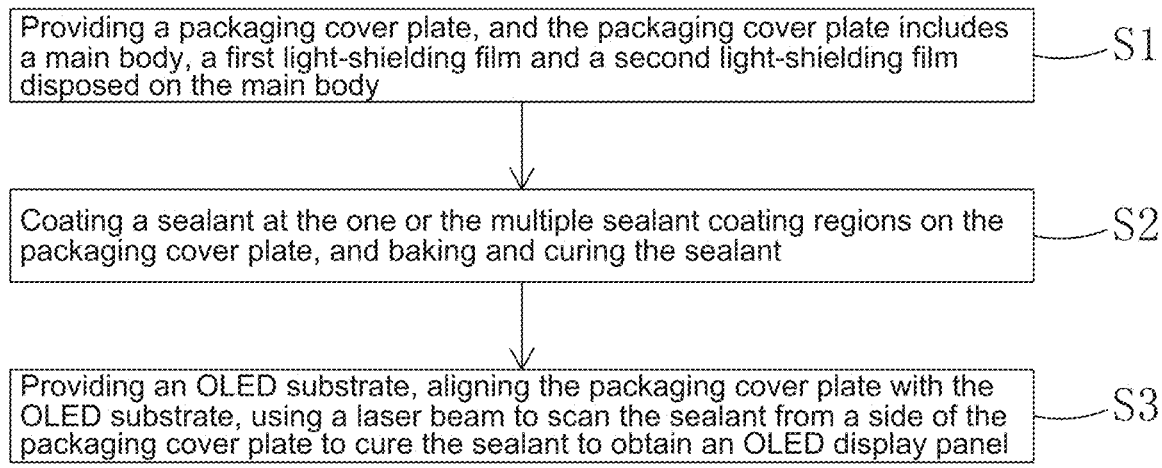
FIG. 13 is a flowchart of a method for manufacturing an OLED display panel according to the present invention.
Figure 14:
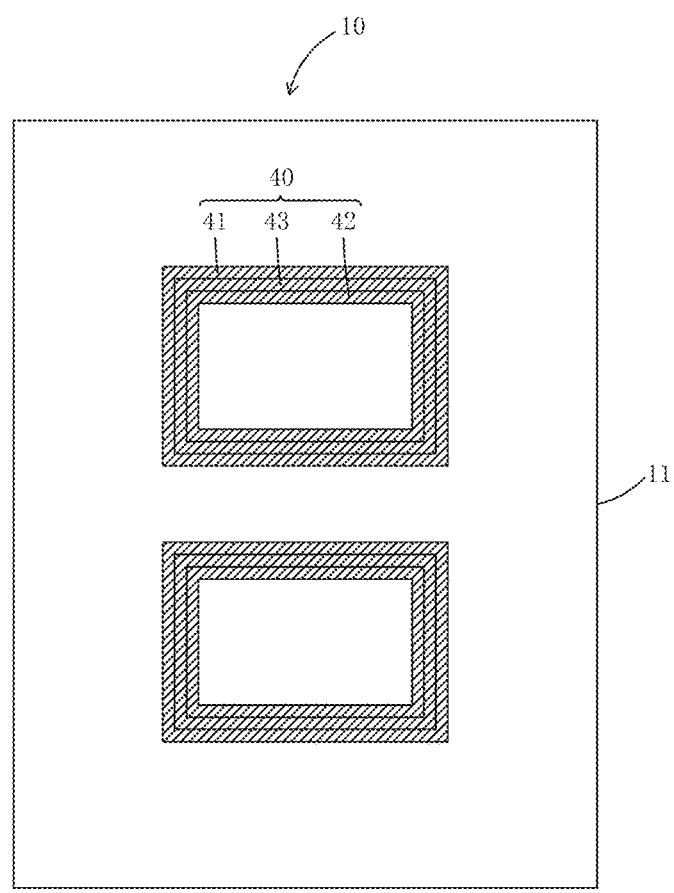
FIG. 14 is a schematic top view of the packaging cover plate without providing with a first light-shielding film and a second light-shielding film of the present invention.
Figure 15:
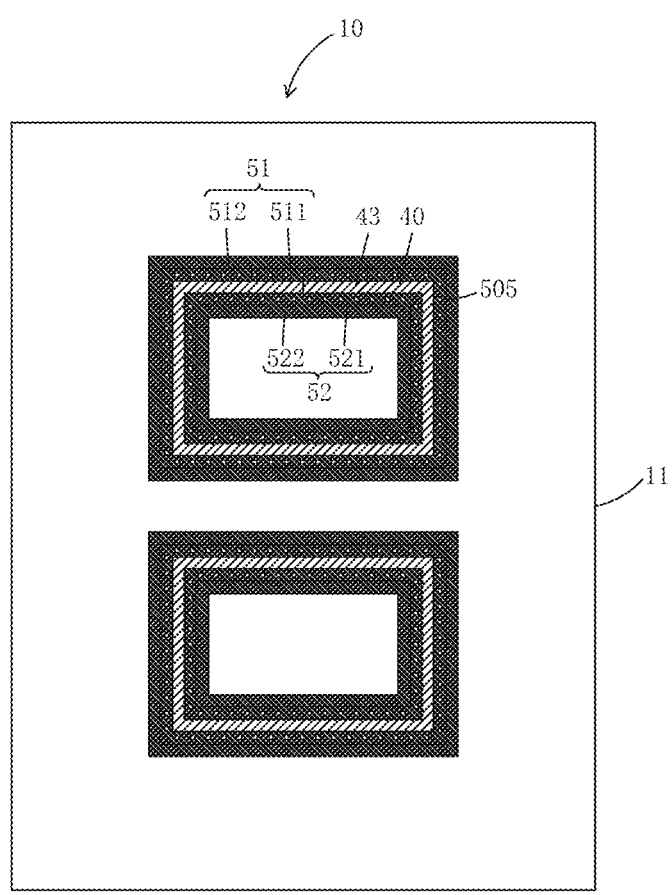
FIG. 15 is a schematic top view of the packaging cover plate providing with the first light-shielding film and the second light-shielding film of the present invention.

With reference to FIG. 13, which is a manufacturing method for an OLED display panel of the present invention, and including following steps:

Step 1: as shown in FIG. 14 to FIG. 17, providing a packaging cover plate 10, and the packaging cover plate 10 includes a main body 11, a first light-shielding film 51 and a second light-shielding film 52 disposed on the main body 11. The main body 11 is provided with one or multiple sealant coating region 40. The sealant coating region 40 includes a sealant thick region 43 and a first sealant thin region 41a and second sealant thin region 42 which are located at two sides of the sealant thick region 43. The first light-shielding film 51 and the second light-shielding film 52 are correspondingly disposed at two sides of the sealant thick region 43.

Defining an edge of each of the first sealant thin region 41 the second sealant thin region 42, the first light-shielding film 51 and a second light-shielding film 52 which is closed to the sealant thick region 43 as an inner edge, and defining an edge of each of the first sealant thin region 41, the second sealant thin region 42, the first light-shielding film 51 and the second light-shielding film 52 which is away from the sealant thick region 43 as an outer edge.

An inner edge of the first light-shielding film 51 and an inner edge of the first sealant thin region 41 are aligned; an outer edge of the first light-shielding film 51 exceeds an outer edge of the first sealant thin region 41. An inner edge of the second light-shielding film 52 and an inner edge of the second sealant region 42 are aligned; an outer edge of the second light-shielding film 52 exceeds an outer edge of the second sealant thin region 42.

The first light-shielding film 51 includes a first semi-transparent region 511 that is completely overlapped with the first sealant thin region 41 and a first light-blocking region 512 that is disposed outside the first semi-transparent region 511. The transmittance of the first semi-transparent region 511 is gradually decreased along direction from the inner edge to the outer edge of the first light-shielding film 51.

The second light-shielding film 52 includes a second semi-transparent region 521 that is completely overlapped with the second sealant thin region 42 and a second light-blocking region 522 that is disposed inside the second semi-transparent region 521. The transmittance of the second semi-transparent region 521 is gradually decreased along a direction from the inner edge to the outer edge of the second light-shielding film 52.

Through disposing outer edges of the first light-shielding film 51 and the second light-shielding film 52 to be exceeded outer edges of the first sealant thin region 41 and the second sealant thin region 42 (that is two side edges of the sealant coating region 40). In the subsequent laser scanning process for the sealant 30, the burning of the electrode 23 by the laser on the OLED substrate 20 can be effectively avoided.

Through disposing the transmittance of the first semi-transparent region 511 gradually decreasing along a direction from the inner edge to an outer edge (that is, a direction of decreasing thickness at the thin layer region of the sealant) of the first light-shielding film 51, and disposing the transmittance of the second semi-transparent region 521 gradually decreasing along a direction from the inner edge to an outer edge (that is, a direction of decreasing thickness at the thin layer region of the sealant) of the second light-shielding film 52, the exposure amount by the laser at the thin layer region of the sealant is gradually decreased along a direction that the thickness of the thin layer region is decreased so that the burning of the thin layer region of the sealant by too much laser can be avoided in order to increase the packaging effect.

Figure 16:
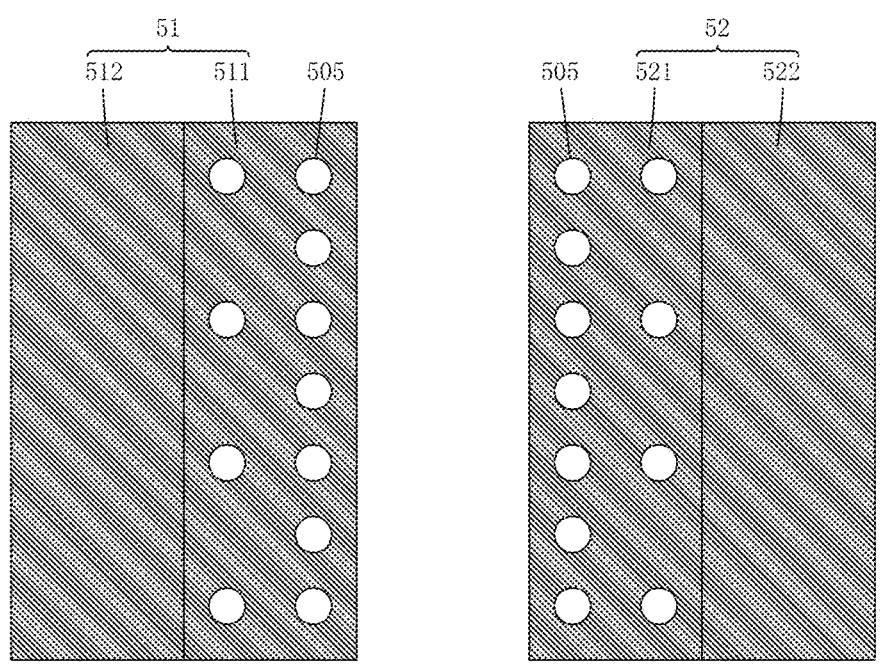
FIG. 16 is a partially enlarged schematic view of the first light-shielding film and the second light-shielding film in a packaging cover plate according to a first embodiment of the present invention.
Figure 17:
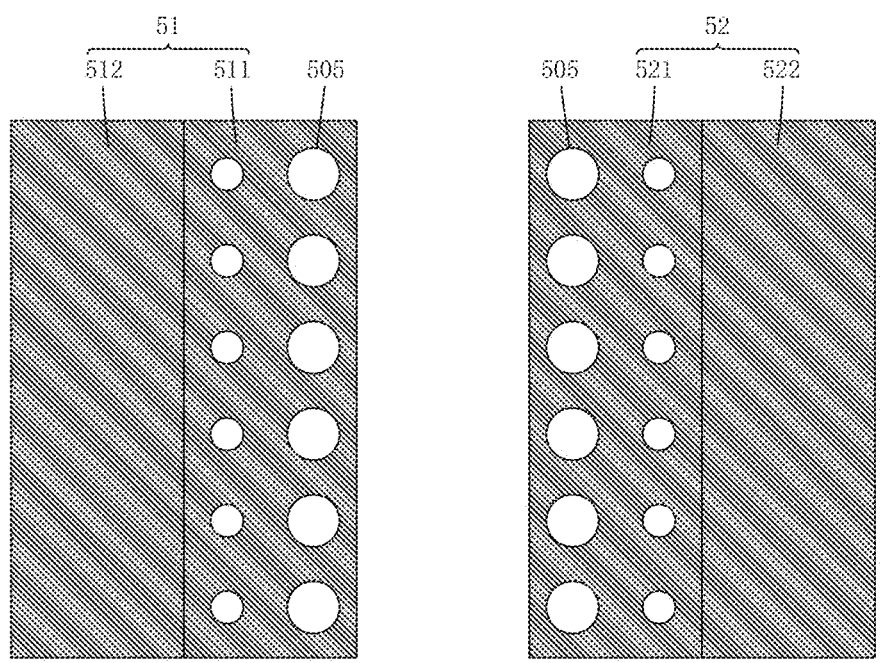
FIG. 17 is a partially enlarged schematic view of the first light-shielding film and the second light-shielding film in a packaging cover plate according to a second embodiment of the present invention.

Specifically, as shown in FIG. 16 and FIG. 17, the first semi-transparent region 511 is provided with multiple hollow patterns 505. As shown in FIG. 16, areas of the multiple hollow patterns 505 in the first semi-transparent region 511 are the same. The density of the first semi-transparent region 511 is gradually decreased along a direction from the inner edge to the outer edge of the first light-shielding thin film 51. Or, as shown in FIG. 17, the multiple hollow patterns 505 are evenly distributed in the first semi-transparent region 511, and areas of the multiple hollow patterns 505 are gradually decreased along a direction from the inner edge to the outer edge of the first light-shielding film 51. The above two solutions can realize the transmittance of the first semi-transparent region 511 gradually decreasing along the direction from the inner edge to the outer edge of the first light-shielding film 51.

Specifically, as shown in FIG. 16 and FIG. 17, the second semi-transparent region 521 is provided with multiple hollow patterns 505. As shown in FIG. 16, areas of the multiple hollow patterns 505 in the second semi-transparent region 521 are the same. The density of the second semi-transparent region 521 is gradually decreased along a direction from the inner edge to the outer edge of the second light-shielding film 52. Or, as shown in FIG. 17, the multiple hollow patterns 505 are evenly distributed in the second semi-transparent region 521, and areas of the multiple hollow patterns 505 are gradually decreased along a direction from the inner edge to the outer edge of the second light-shielding film 52. The above two solutions can realize the transmittance of the second semi-transparent region 521 gradually decreasing along the direction from the inner edge to the outer edge of the second light-shielding film 52.

Specifically, a shape of the hollow pattern 505 can be a circle or other shapes.

Specifically, a material of each of the first light-shielding film 51 and the second light-shielding film 52 can be an opaque material having a reflective property or a black light-shielding material without a reflective property. Besides, a material of each of the first light-shielding film 51 and the second light-shielding film 52 should have a high temperature resistance property.

Preferably, a surface of a region of the main body 11 corresponding to the first light-shielding film 51 and the second light-shielding film 52 should be frosted such that a surface of each of the first light-shielding film 51 and the second light-shielding film 52 contacting with the main body 11 is a frosted surface. Accordingly, when a material of each of the first light-shielding film 51 and the second light-shielding film 52 can be an opaque material having a reflective property the frosted surface can make the laser irradiated on the surface of the first light-shielding film Si and the second light-shielding film 52 to generate a diffuse reflection in order to avoid that the laser is directly reflected to the laser head 81 to protect the laser head 81 from being burned and damaged.

Specifically, when material of each of the first light-shielding thin film 51 and the second light-shielding thin film 52 is a black light-shielding material without a reflective property, the first light-shielding thin film 51 and the second light-shielding thin film 52 can directly absorb the laser irradiated on surfaces of the first light-shielding thin film 51 and the second light-shielding thin film 52 in order to avoid that the laser is directly reflected to the laser head 81 to protect the laser head 81 from being burned and damaged.

Specifically, the frosted treatment can be a dry etching.

Specifically, the main body is a transparent substrate, and preferably a glass substrate.

Figure 18:
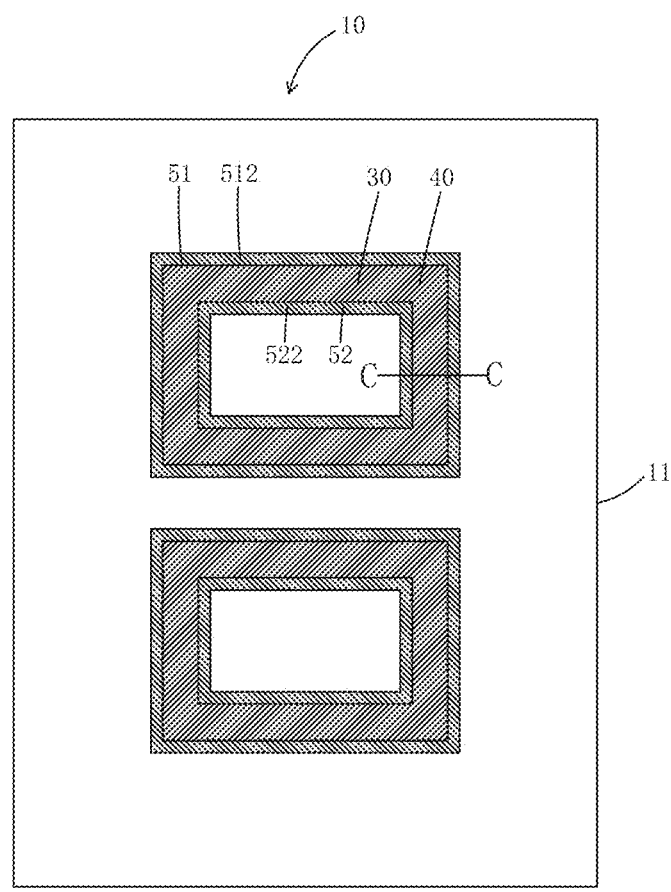
FIG. 18 is a schematic top view of step 2 in the method for manufacturing an OLED display panel according to the present invention.
Figure 19:
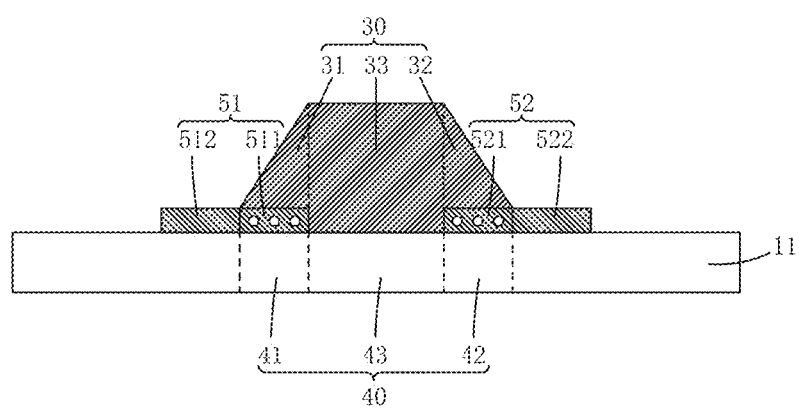
FIG. 19 is a schematic sectional view along C-C line of FIG. 18.

Step 2: as shown in FIG. 18 and FIG. 19, coating a sealant 30 at the one or the multiple sealant coating regions 40 on the packaging cover plate, and baking and curing the sealant 30.

Specifically, the sealant 30 is a silicone sealant (frit glue). Specifically, in the step 2, a temperature for baking and curing is greater than 500° C. As shown in FIG. 19, because of the feature of the frit glue, after baking and curing, a cross section of the sealant 30 is trapezoidal. The sealant 30 includes a thick layer region 33 corresponding to the sealant thick region 43, and a first thin layer region 31 and a second thin layer region 32 respectively corresponding to the first sealant thin region 41 and the second sealant thin region 42.

Specifically, the step 2 usually includes a step of cleaning the packaging cover plate 10 before coating a sealant 30 at one or multiple sealant coating regions 40 on the packaging cover plate 10, and baking and curing the sealant 30

Step 3: as shown in FIG. 20 to FIG. 27, providing an OLED substrate 20, aligning the packaging cover plate 20 with the OLED substrate 20. Using a laser beam 95 to scan the sealant 30 from a side of the packaging cover plate 10 so as to cure the sealant 30 in order to obtain an OLED display panel.

Specifically, in the step 3, using a laser emitting device 80 to scan the sealant 30, and the laser emitting device 80 includes a laser head 81, When the laser emitting device 80 is operating, a laser beam 95 is emitted from the laser head 81 to irradiate on the sealant 30.

Specifically, in the step 3, the sealant 30 is melted by the high temperature of the laser to be cooled and cured so as to achieve the purpose of bonding the packaging cover plate 10 and the OLED substrate 20, thereby realizing a real encapsulation effect.

Specifically, the laser scanning process is performed in an atmospheric environment.

Figure 24:
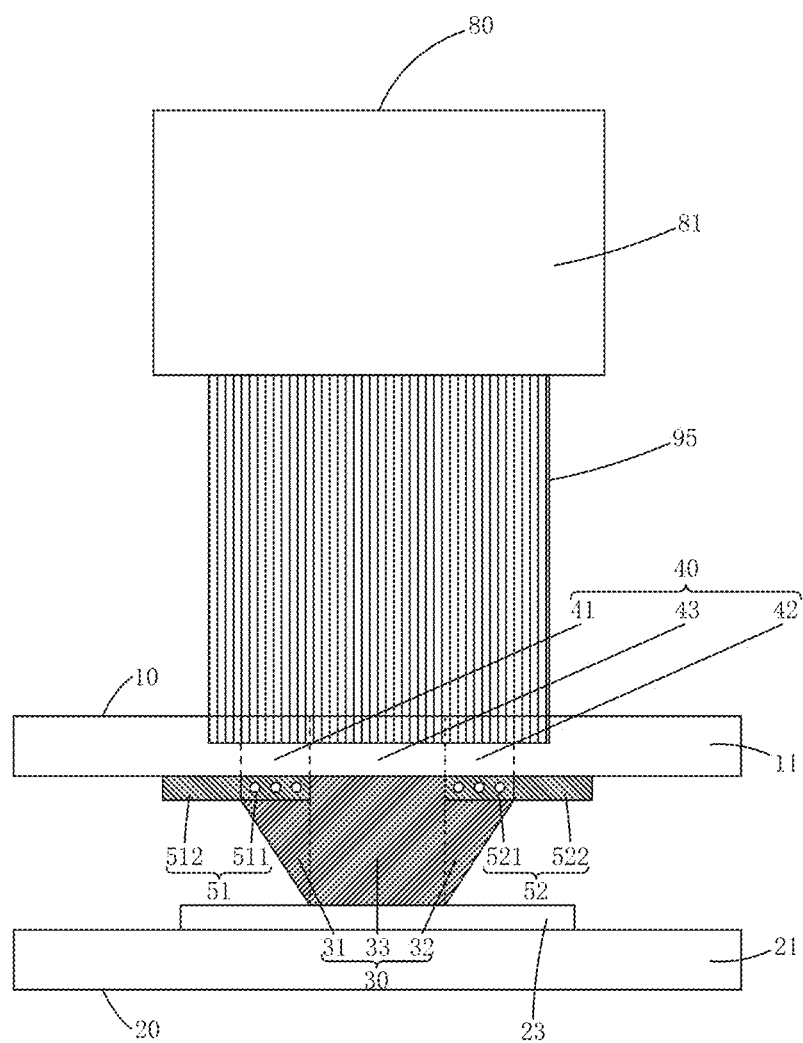
FIG. 24 is a schematic cross-sectional view of step 33 in the method for manufacturing an OLED display panel according to the present invention.

Specifically, as shown in FIG. 24, in step 3, a diameter of the laser beam 95 is greater than a width of the sealant coating region 40 to scan all regions of the sealant 30 such that the sealant 30 is completely cured.

Specifically, as shown in FIG. 24, outer edges of the first light-shielding film 51 and the second light-shielding film 52 respectively exceed two sides of the laser beam 95 to block the laser light beyond the sealant coating region 40 in order to avoid the portion the laser beam to irradiate on the electrode 23 of the OLED substrate 20 so as to effectively protect the electrode 23.

Besides, in the process of the scanning the sealant 30 by laser, because each of the first light-shielding film 51 and the second light-spieling film 52 is a frosted surface, when the laser irradiates on the surfaces of the first light-shielding film 51 and the second light-spieling film 52, a diffused reflection is generated in order to avoid the laser to directly reflect at the laser head 81 so as to protect the laser head 81 from being damaged.

Because the transmittance of the first semi-transparent region 511 gradually decreasing along a direction from the inner edge to an outer edge of the first light-shielding film 51, and the transmittance of the second semi-transparent region 521 gradually decreasing along a direction from the inner edge to an outer edge of the second light-shielding film 52, the exposure amount by the laser at the thin layer region of the sealant is gradually decreased along a direction that the thickness of the thin layer region is decreased so that the burning of the thin layer region of the sealant by too much laser can be avoided in order to increase the packaging effect and decrease the generation of the particles.

Comparing to the conventional art, in the laser scanning process, the first light-shielding film 51 and the second light-shielding film 52 function as a mask plate and do not need to perform a precise alignment during operation.

Figure 20:
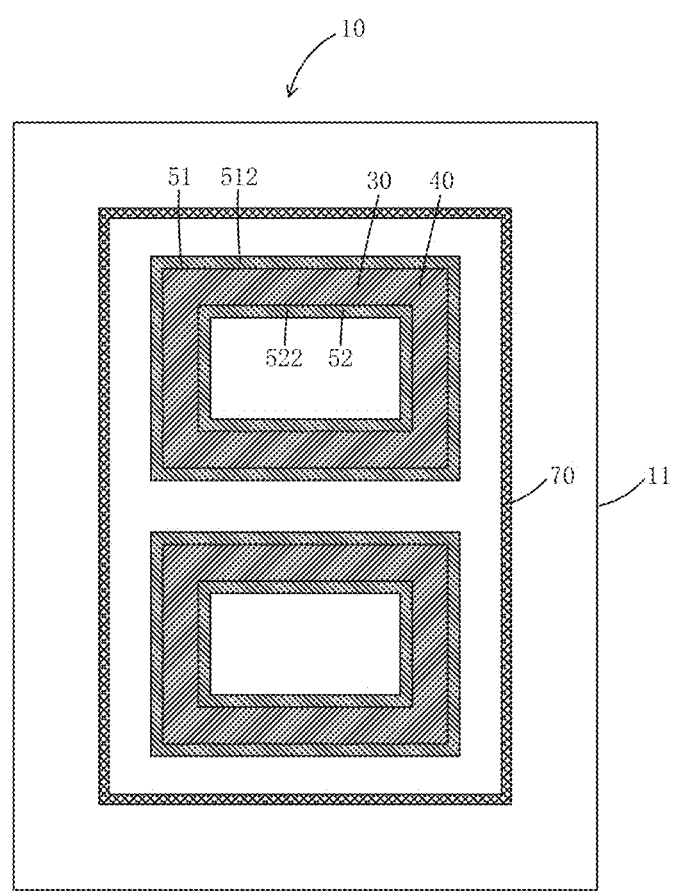
FIG. 20 is a schematic top view of step 31 in the method for manufacturing an OLED display panel according to the present invention.

Specifically, the step 3 includes:

Step 31, as shown in FIG. 20, coating an UV adhesive 70 at an outer periphery of the one or the multiple sealant coating regions 40 of the packaging cover plate 10.

Specifically, the step 3 is performed in a nitrogen (N2) environment.

Specifically, the purpose of coating the UV adhesive 70 is to use the UV adhesive 70 to temporarily fix the packaging cover plate 10 and the OLED substrate 20 before sealing and connecting the packaging cover plate 10 and the OLED substrate 20 with the sealant 30. Temporarily blocking the OLED device 22 from contacting with the outside air to act as a dummy encapsulation.

Figure 21:
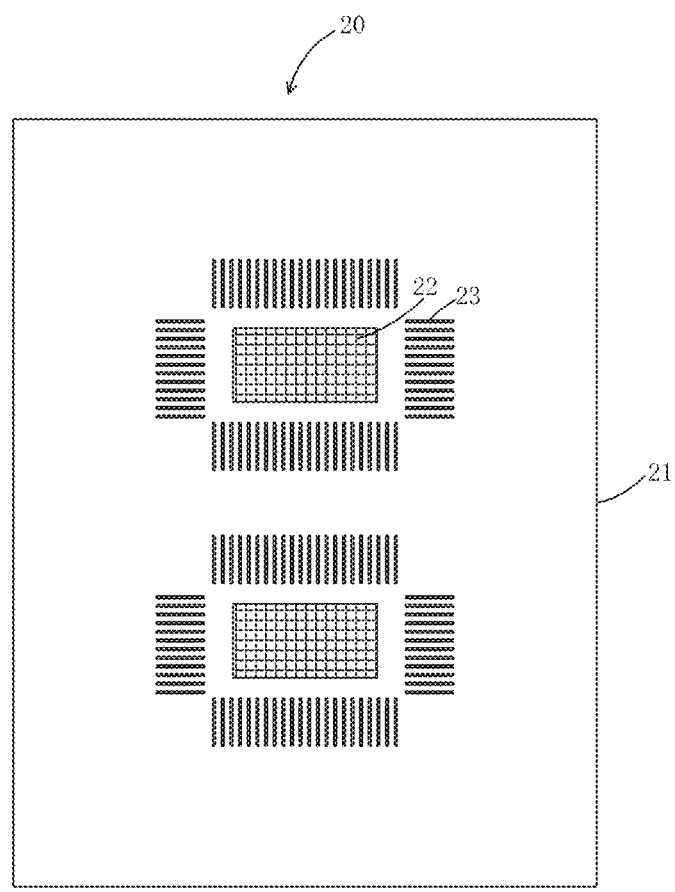
FIG. 21 is a schematic top view of an OLED substrate in the present invention.
Figure 22:
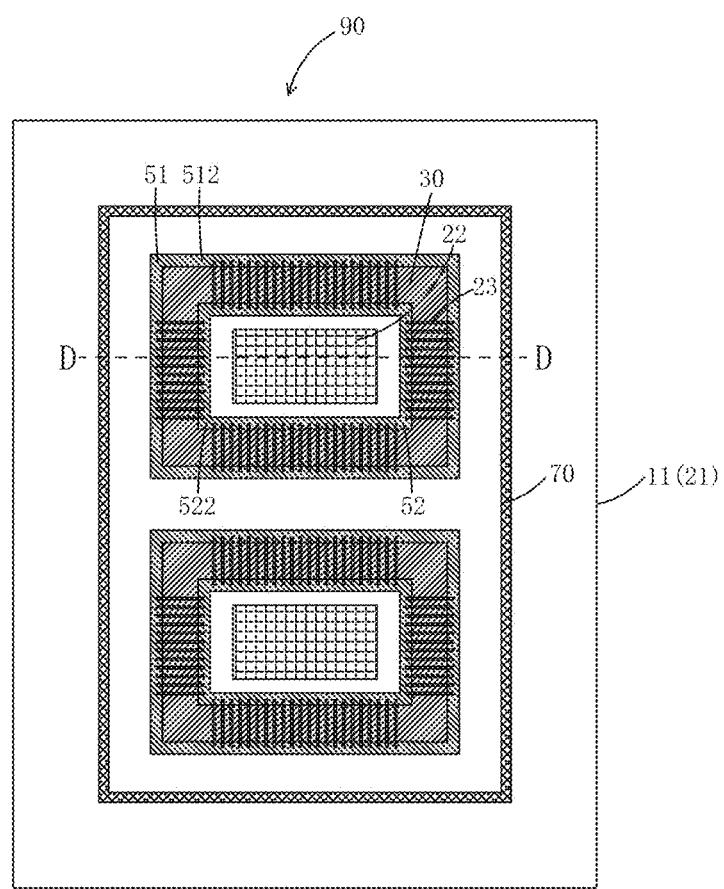
FIG. 22 is a schematic top view of an OLED package structure obtained by step 32 in the method for manufacturing an OLED display panel according to the present invention.
Figure 23:
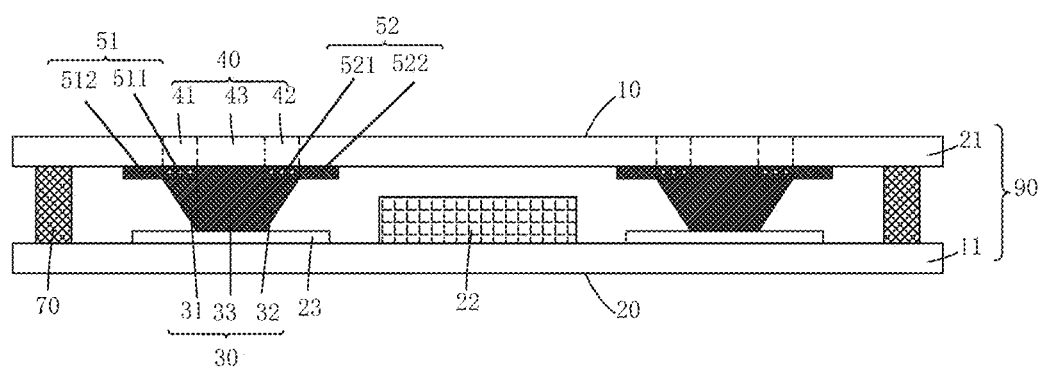
FIG. 23 is a schematic sectional view along D-D line of FIG. 22.

Step 32, as shown in FIG. 21 to FIG. 23, providing the OLED substrate 20, and aligning and adhering the packaging cover plate 10 with the OLED substrate 20 to obtain an OLED encapsulation structure 90, and performing an UV light irradiation to the UV adhesive 70 in the OLED encapsulation structure 90 to cure the UV adhesive 70.

Specifically, the step 32 is performed in a nitrogen (N2) environment.

Specifically, as shown in FIG. 21, the OLED substrate 20 includes a base substrate 21 and one or multiple OLED devices 22 disposed on the base substrate 21. The one or multiple MED devices 22 are disposed corresponding to an interior of the one or multiple sealant coating region 40 on the packaging cover plate 10.

The OLED substrate 20 further includes electrodes 23 disposed on the substrate 21 and corresponding to the periphery of the OLED device 22. The distribution region of the electrodes 23 includes both sides of the sealant coating region 40.

In step 33, as shown in FIG. 24, using the laser beam 95 to scan the sealant 30 from the side of the packaging cover plate 10 in the OLED encapsulation structure 90 in order to cure the sealant 30.

Figure 25:
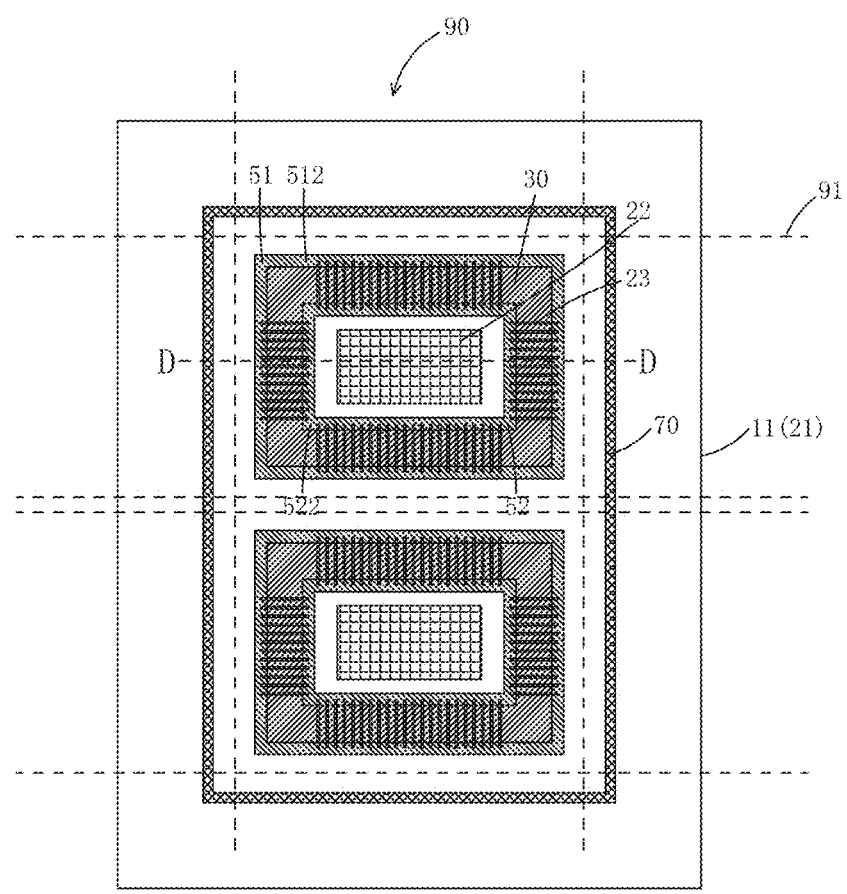
FIG. 25 is a schematic top view of step 34 in the method for fabricating an OLED display panel according to the present invention.
Figure 26:
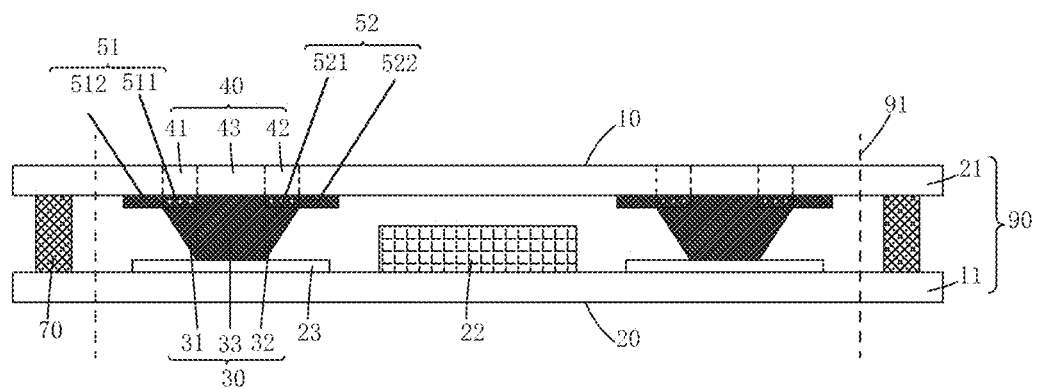
FIG. 26 is a schematic sectional view along D-D line of FIG. 25.
Figure 27:
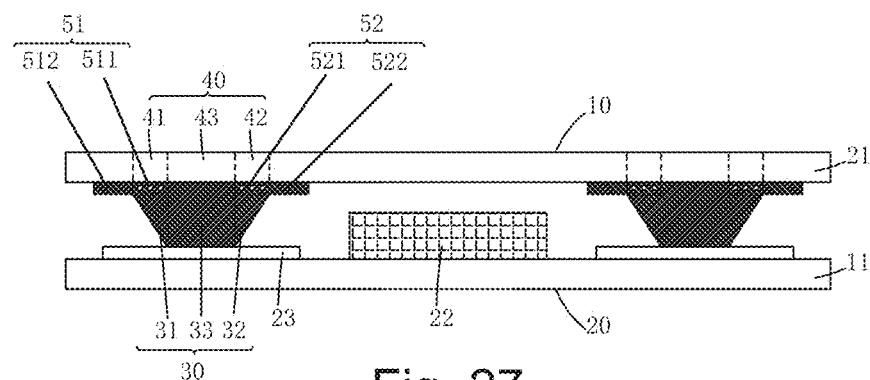
FIG. 27 is a cross-sectional view of an OLED display panel obtained by step 34 in the method for manufacturing an OLED display panel according to the present invention.

Step 34, as shown in FIG. 25 to FIG. 27, cutting the OLED encapsulation structure 90 along a cutting line 91 between the sealant 30 and the UV adhesive 70, and discarding the scrap with the UV adhesive 70 to obtain the OLED display panel packaged by the sealant 30.

In the method for fabricating the OLED display panel, a light-shielding film is disposed on the packaging cover plate 10 to prevent the laser from illuminating on the electrodes 23 of the OLED substrate 20 during the laser scanning of the sealant 30, so as to effectively protect the electrode 23, The light shielding film is also provided. The portion of the thin layer region that overlaps with the thin layer region of the sealant 30 has gradually decreasing light transmittance, which can prevent the problem that the thin layer region of the sealant 30 is scorched by excessive laser energy, sufficiently ensures that the packaging effect, and reduces the generation of particles. In addition, the surface of the light-shielding film irradiated with laser light is also provided with a frosted surface, which can cause diffused reflection of the laser light irradiated on the light-shielding film to prevent the laser from directly reflecting on the laser head 81 and protect the laser head 81 from being burned and damaged.

With reference to FIG. 27, based on the manufacturing method of the OLED display panel, the present invention provides an OLED display panel, including: a packaging cover plate 10 and an OLED substrate 20 disposed oppositely, and a sealant 30 disposed between the packaging cover plate 10 and an OLED substrate 20

The packaging cover plate 10 includes a main body 11, a first light-shielding film 51 and a second light-shielding film 52 disposed on the main body 11. The main body 11 is provided with one or multiple sealant coating region 40. The sealant coating region 40 includes a sealant thick region 43 and a first sealant thin region 41 and a second sealant thin region 42 which are located at two sides of the sealant thick region 43. The first light-shielding film 51 and the second light-shielding film 52 are correspondingly disposed at two sides of the sealant thick region 43.

Defining an edge of each of the first sealant thin region 41, the second sealant thin region 42, the first light-shielding film 51 and the second light-shielding film 52 which is closed to the sealant thick region 43 as an inner edge, and defining an edge of each of the first sealant thin region 41, the second sealant thin region 42, the first light-shielding film 51 and the second light-shielding film 52 which is away from the sealant thick region 43 as an outer edge.

An inner edge of the first light-shielding film 51 and an inner edge of the first sealant thin region 41 are aligned; an outer edge of the first light-shielding film 51 exceeds an outer edge of the first sealant thin region 41. An inner edge of the second light-shielding film 52 and an inner edge of the second sealant region 42 are aligned; an outer edge of the second light-shielding film 52 exceeds an outer edge of the second sealant thin region 42.

The first light-shielding film 51 includes a first semi-transparent region 511 that is completely overlapped with the first sealant thin region 41 and a first light-blocking region 512 that is disposed outside the first semi-transparent region 511. The transmittance of the first semi-transparent region 511 is gradually decreased along a direction from the inner edge to the outer edge of the first light-shielding film 51.

The second light-shielding film 52 includes a second semi-transparent region 521 that is completely overlapped with the second sealant thin region 42 and a second light-blocking region 522 that is disposed inside the second semi-transparent region 521. The transmittance of the second semi-transparent region 521 is gradually decreased along a direction from the inner edge to the outer edge of the second light-shielding film 52.

Specifically, as shown in FIG. 16 and FIG. 17, the first semi-transparent region 511 is provided with multiple hollow patterns 505. As shown in FIG. 16, areas of the multiple hollow patterns 505 in the first semi-transparent region 511 are the same. The density of the multiple hollow patterns 505 is gradually decreased along a direction from the inner edge to the outer edge of the first light-shielding film 51. Or, as shown in FIG. 17, the multiple hollow patterns 505 are evenly distributed in the first semi-transparent region 511, and areas of the multiple hollow patterns 505 are gradually decreased along a direction from the inner edge to the outer edge of the first light-shielding film 51. The above two solutions can realize the transmittance of the first semi-transparent region 511 gradually decreasing along the direction from the inner edge to the outer edge of the first light-shielding film 51.

Specifically, as shown in FIG. 16 and FIG. 17, the second semi-transparent region 521 is provided with multiple hollow patterns 505. As shown in FIG. 16, areas of the multiple hollow patterns 505 in the second semi-transparent region 521 are the same. The density of the multiple hollow patterns 505 is gradually decreased along a direction from the inner edge to the outer edge of the second light-shielding film 52. Or, as shown in FIG. 17, the multiple hollow patterns 505 are evenly distributed in the second semi-transparent region 521, and areas of the multiple hollow patterns 505 are gradually decreased along a direction from the inner edge to the outer edge of the second light-shielding film 52. The above two solutions can realize the transmittance of the second semi-transparent region 521 gradually decreasing along the direction from the inner edge to the outer edge of the second light-shielding film 52.

Specifically, a shape of the hollow pattern 505 can be a circle or other shapes.

Specifically, a material of each of the first light-shielding film 51 and the second light-shielding film 52 can be an opaque material having a reflective property or a black light-shielding material without a reflective property. Besides, a material of each of the first light-shielding film 51 and the second light-shielding film 52 should have a high temperature resistance property.

Preferably, a surface of a region of the main body 11 corresponding to the first light-shielding film 51 and the second light-shielding film 52 is frosted such that a surface of each of the first light-shielding film 51 and the second light-shielding film 52 contacting with the main body 11 is a frosted surface.

Specifically, the opaque material having a reflective property can be a metal;

Specifically, the sealant 30 is a glass cement (frit cement).

Specifically, as shown in FIG. 19, the cross-section of the sealant 30 is trapezoidal, and the sealant 30 includes a thick layer region 33 corresponding to the thick sealant region 43, and a first thin layer region 31 and a second thin layer region 32 respectively corresponding to the first sealant thin region 41 and the second sealant thin region 42.

Specifically, the main body 11 is a transparent substrate, preferably a glass substrate.

The OLED display panel is manufactured based on the manufacturing method of the OLED display panel. By providing a light shielding film on the packaging cover plate 10, the packaging effect can be improved and the production yield can be improved.

In summary, in the method for fabricating the OLED display panel, a light-shielding film is disposed on the packaging cover plate to prevent the laser from illuminating on the electrodes of the OLED substrate during the laser scanning of the sealant, so as to effectively protect the electrode. The light shielding film is also provided. The portion of the thin layer region that overlaps with the thin layer region of the sealant 30 has gradually decreasing light transmittance, which can prevent the problem that the thin layer region of the sealant is scorched by excessive laser energy, sufficiently ensures that the packaging effect, and reduces the generation of particles. In addition, the surface of the light-shielding film irradiated with laser light is also provided with a frosted surface, which can cause diffused reflection of the laser light irradiated on the light-shielding film to prevent the laser from directly reflecting on the laser head 81 and protect the laser head 81 from being burned and damaged. The OLED display panel is manufactured based on the manufacturing method of the OLED display panel. By providing a light shielding film on the packaging cover plate, the packaging effect can be improved and the production yield can be improved.

As described above, those skilled in the art can make other various corresponding changes and modifications according to the technical solutions and technical ideas of the present invention, and all such changes and modifications should also be covered by the protection scope of the claims of the present invention.

What is claimed is:

1. A manufacturing method for an OLED display panel comprising steps of:
    step 1: providing a packaging cover plate, wherein the packaging cover plate includes a main body, and a first light-shielding film and a second light-shielding film which are disposed on the main body; the main body is provided with one or multiple sealant coating region; the sealant coating region includes a sealant thick region, and a first sealant thin region and a second sealant thin region which are located at two sides of the sealant thick region; the first light-shielding film and the second light-shielding film are correspondingly disposed at two sides of the sealant thick region;
    defining an edge of each of the first sealant thin region, the second sealant thin region, the first light-shielding film and a second light-shielding film which is closed to the sealant thick region as an inner edge, and defining an edge of each of the first sealant thin region, the second sealant thin region, the first light-shielding film and the second light-shielding film which is away from the sealant thick region as an outer edge;

wherein an inner edge of the first light-shielding film and an inner edge of the first sealant thin region are aligned; an outer edge of the first light-shielding film exceeds an outer edge of the first sealant thin region; an inner edge of the second light-shielding film and an inner edge of the second sealant region are aligned; an outer edge of the second light-shielding film exceeds an outer edge of the second sealant thin region;

the first light-shielding film includes a first semi-transparent region that is completely overlapped with the first sealant thin region and a first light-blocking region that is disposed outside the first semi-transparent region; the transmittance of the first semi-transparent region is gradually decreased along direction from the inner edge to the outer edge of the first light-shielding film;

the second light-shielding film includes a second semi-transparent region that is completely overlapped with the second sealant thin region and a second light-blocking region that is disposed inside the second semi-transparent region; the transmittance of the second semi-transparent region is gradually decreased along a direction from the inner edge to the outer edge of the second light-shielding film;

step 2: coating a sealant at the one or the multiple sealant coating regions on the packaging cover plate, and baking and curing the sealant; and step 3: providing an OLED substrate, aligning the packaging cover plate with the OLED substrate; using a laser beam to scan the sealant from a side of the packaging cover plate so as to cure the sealant in order to obtain an OLED display panel;

wherein the first and second sealant thin regions are spaced from each other by the sealant thick region such that the inner edges of the first light-shielding film and the second light-shielding film that are respectively aligned with the inner edges of the first light-shielding film and the second light-shielding film are spaced from each other to expose a part of the main body of the packaging cover plate that corresponds to the sealant thick region, and wherein the sealant is coated such that a first portion of the sealant is coated on the sealant thick region to be directly deposited on a surface of the main body of the packaging cover plate, and a second portion of the sealant is coated on the first and second light-shielding films and is separated from the surface of the main body of the packaging cover plate.

2. The manufacturing method for an OLED display panel according to claim 1, wherein the step 3 comprises steps of:

step 31: coating an UV adhesive at an outer periphery of the one or the multiple sealant coating regions of the packaging cover plate;

step 32: providing the OLED substrate, and aligning and adhering the packaging cover plate with the OLED substrate to obtain an OLED encapsulation structure, and performing an UV light irradiation to the UV adhesive in the OLED encapsulation structure to cure the UV adhesive;

step 33: using the laser beam to scan the sealant from the side of the packaging cover plate in the OLED encapsulation structure in order to cure the sealant; and step 34: cutting the OLED encapsulation structure along a cutting line between the sealant and the UV adhesive to obtain the OLED display panel packaged by the sealant.

3. The manufacturing method for an OLED display panel according to claim 1, wherein the first semi-transparent region is provided with multiple hollow patterns, areas of the multiple hollow patterns in the first semi-transparent region are the same, the density of the multiple hollow patterns is gradually decreased along a direction from the inner edge to the outer edge of the first light-shielding film; or, the multiple hollow patterns are evenly distributed in the first semi-transparent region, and areas of the multiple hollow patterns are gradually decreased along a direction from the inner edge to the outer edge of the first light-shielding film; and the second semi-transparent region is provided with multiple hollow patterns, areas of the multiple hollow patterns in the second semi-transparent region are the same, the density of the multiple hollow patterns is gradually decreased along a direction from the inner edge to the outer edge of the second light-shielding film; or, the multiple hollow patterns are evenly distributed in the second semi-transparent region, and areas of the multiple hollow patterns are gradually decreased along a direction from the inner edge to the outer edge of the second light-shielding film.

4. The manufacturing method for an OLED display panel according to claim 1, wherein a surface of a region of the main body corresponding to the first light-shielding film and the second light-shielding film is frosted such that a surface of each of the first light-shielding film and the second light-shielding film contacting with the main body is a frosted surface;

the sealant is a glass cement; in the step 2, a temperature for baking and curing is greater than 500° C.; after baking and curing, a cross section of the sealant is trapezoidal; the sealant includes a thick layer region corresponding to the sealant thick region, and a first thin layer region and a second thin layer region respectively corresponding to the first sealant thin region and the second sealant thin region.

5. The manufacturing method for an OLED display panel according to claim 1, wherein in step 3, a diameter of the laser beam is greater than a width of the sealant coating region; outer edges of the first light-shielding film and the second light-shielding film respectively exceed two sides of the laser beam;

a material of each of the first light-shielding film and the second light-shielding film is an opaque material having a reflective property or a black light-shielding material without a reflective property; the sealant is a glass cement.

\* \* \* \* \*